United States Patent [19]

Conzelmann et al.

[11] Patent Number: 5,210,439
[45] Date of Patent: May 11, 1993

[54] POWER TRANSISTOR MONOLITHIC INTEGRATED STRUCTURE

[75] Inventors: Gerhard Conzelmann, Leinfelden-Oberaichen; Ludger Olbrich, Reutlingen; Gerhard Fiedler, Neckartailfingen, all of Fed. Rep. of Germany

[73] Assignee: Robert Bosch GmbH, Stuttgart, Fed. Rep. of Germany

[21] Appl. No.: 728,011

[22] Filed: Jul. 5, 1991

Related U.S. Application Data

[63] Continuation of Ser. No. 301,822, Jan. 25, 1989, abandoned.

[30] Foreign Application Priority Data

Jan. 30, 1988 [DE] Fed. Rep. of Germany ....... 3802821

[51] Int. Cl.⁵ ............................................ H01L 23/16
[52] U.S. Cl. .................................. 257/587; 257/541; 257/579; 257/584; 257/784

[58] Field of Search ...................... 357/75, 81, 68, 70, 357/80, 34, 37

[56] References Cited

U.S. PATENT DOCUMENTS

| | | | |
|---|---|---|---|
| 4,639,760 | 1/1987 | Granberg et al. | 357/75 |
| 4,783,697 | 11/1988 | Benenati et al. | 357/80 |
| 4,907,068 | 3/1990 | Amann et al. | 357/74 |

Primary Examiner—William Mintel
Assistant Examiner—Roy Potter
Attorney, Agent, or Firm—Michael J. Striker

[57] ABSTRACT

A monolithic integrated power transistor chip includes a plurality of transistor cells arranged in two opposite and mutually spaced rows. Each cell has emitter- and collector connection spots arranged side-by-side and connected to corresponding branch conductors directed by rows of connection points extending along opposite edges on the upper surface of the chip.

37 Claims, 4 Drawing Sheets

POWER TRANSISTOR MONOLITHIC INTEGRATED STRUCTURE

This application is a continuation of application Ser. No. 301,822, filed Jan. 25, 1989, now abandoned.

BACKGROUND OF THE INVENTION

The present invention relates to a power transistor monolithic integrated chip structure of a rectangular configuration assembled of a plurality of parallel connected transistor cells.

Power transistor monolithic integrated chip structures of this kind are known wherein the transistor cells of which the power transistor is assembled have the same or at least a similar design whereby the cells, particularly their emitters, are substantially larger in length than in width. However, due to voltage drops on emitter- and collector conductors the maximum length of each cell is limited. In order to compensate approximation these voltage drops approximately to zero, it has been also known to arrange the connection for the emitter at one end and the connection for the collector at the opposite end of the cell.

SUMMARY OF THE INVENTION

An object of the present invention is to provide a power transistor structure of the above described kind wherein the emitter and the collector of the monolithic integrated structure can be constituted respectively, as a single layer connection metallization.

Another objective of this invention is to improve the ratio of the length to the width of individual transistor cells of the power transistor, namely to reduce this ratio in comparison with prior art power transistors and to achieve a substantially square configuration of the transistor chip structure.

Still another object of the present invention is to provide linear power transistors of this kind which are applicable for large currents and power losses, for example for 30 A currents or 100 to 200 W power losses.

In keeping with these objects and others which will become apparent hereinafter, one feature of this invention resides in that the respective transistor cells are arranged in two rows within the chip structure, two rows of connection points are mirror-symmetrically arranged on the upper surface of the chip structure, branch conductors are provided for connecting consecutive connection points in each row to corresponding emitter- and collector contacts or zones in an assigned row of transistor cells, and the rows of connection points extend along opposite edges of the chip structure.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

By means of modern automatic bonding machines it is possible to manufacture economically also semiconductor structural units having a large number of connections. The applicable gauges or diameters of bonding wires can be for example between 40 to 75 um (2 to 3 mil). Since a bonding wire of 50 um can withstand currents of more than 1 A, it is proposed at sufficiently long transistor cells to arrange emitter and collector connections side by side in a row along an outer edge of the chip and in a second row of mirror-symmetrically arranged at the opposite side of the chip. It is of advantage to thermally decouple the two rows of connections by spacing them by a distance which is equal to or greater than to the thickness of the transistor chip. This intermediate range or spacing is with advantage used for the power supply conductors and other circuit components.

The proposed solution enables cells operating with a permanent current of 1 A and above with a cell width of 300 to 400 um; this novel solution represents a compromise between the cross-sections of the conductor webs and the lost power to be conducted away. If the power transistor is employed in linear circuits, measures are necessary for preventing a so called "second breakdown". However, if such measures are to be effective, a relatively high saturation voltage is needed. In an elaboration of this invention, there is provided a parallel-connected switching transistor for lowering the saturation voltage. Moreover, means for an automatic disconnection of defective transistor cells (selfhealing effect) are also provided.

Figure 1:
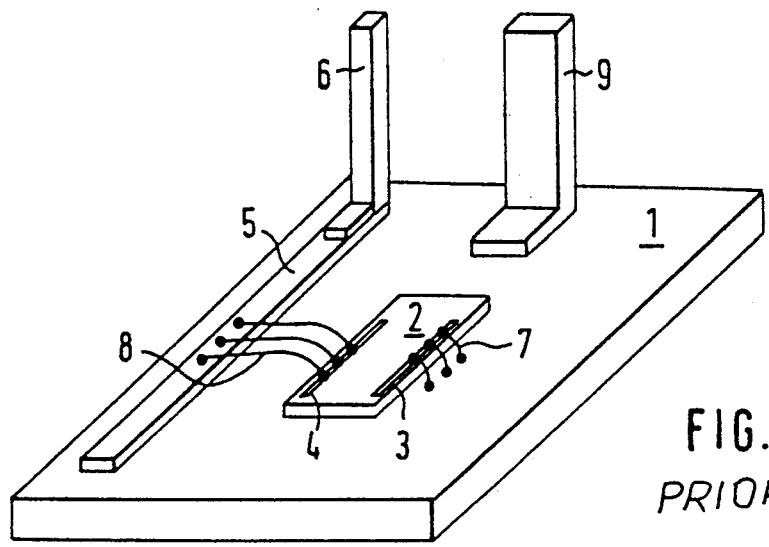
FIG. 1 shows a prior art arrangement of a mounted chip of a power transistor having only a single row of transistor cells.

A prior art monolithic integrated power transistor shown in FIG. 1 includes a base plate 1 of a thermally as well as electrical conducting material, such as for example of copper, for supporting a power transistor chip 2 having only a single row of transistor cells. Reference numeral 3 indicates a connection metallization strip provided on the chip 2 and connected by bonded wires 7 to the base plate 1 which is connected to the negative pole of a non-illustrated power supply. Reference numeral 4 indicates a corresponding metallization strip for collectors of the transistor cells. A metallized, for example a copper plated and nickel coated ceramic strip 5 extends along an edge of the base plate and terminates with an upwardly directed connection pin 6 connectable to a plus pole of the power source. Bonded wires 8 connect the metallization strip 4 for the cell collectors with the metallized ceramic strip 5 of the power transistor. The base plate 1 is connected to the minus pole by an upwardly directed connection pin 9. Of the plurality of bonded wires 7 and 8 only three are indicated in each case. Similarly, the remaining connections of the integrated circuit which are not essential for this invention, are not illustrated.

Figure 2:
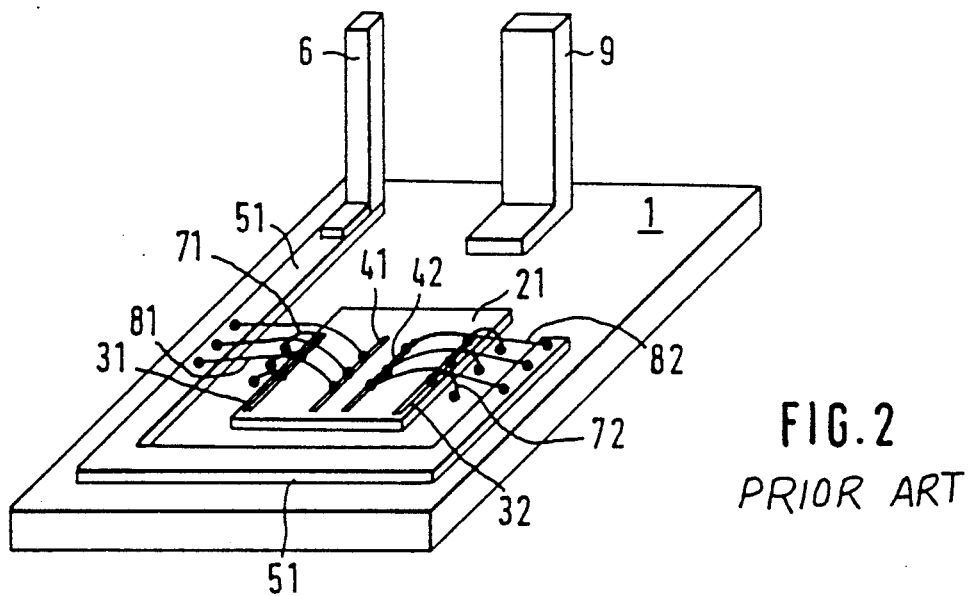
FIG. 2 shows a modification of the transistor of FIG. 1, wherein by a simple mirror-symmetrical development along the collector edge a two part chip results.

In the modification of the power transistor shown in FIG. 2, the same component parts of the embodiment of FIG. 1 are indicated by like reference numerals. In this modification a two row chip 21 results from a mirror symmetrical arrangement of the single row of transistor cells in chip 2. Accordingly, the upper surface of chip 21 is provided with two connection metallizations 31, 32 connected respectively by bonded wires 71, 72 to the base plate 1 and two collector metallizations 41, 42 connected by bonded wires 81, 82 to a U-shaped metal plated ceramic strip 51 surrounding the chip 21. It is evident that in this modification the bonded wires for the collector connections become unduly long and the bonding planes at collector metallization strips 41, 42 are adjacent at both sides of the circuit components.

Figure 3:
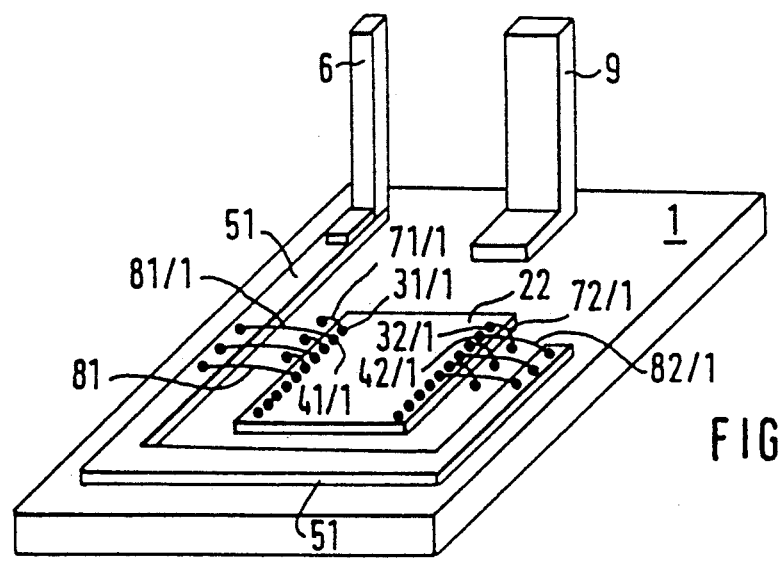
FIG. 3 shows a mounted power transistor chip according to this invention.

In the embodiment according to the invention shown in FIG. 3 there is provided a power transistor chip 22 having two opposite rows of alternating emitter and collector connection points, namely emitter connection points 31/2, 31/2, etc., or 32/1, 32/2, etc. and collector connector points 41/1, 41/2, etc., or 42/1, 42/1, etc. connected to respective emitters or collectors in corresponding rows of transistor cells. For the sake of clarity only a part of connection points bonded and also only a part of bonding wires 71/1 or 72/1 leading to the base plate 1 and bonded wires 81/1, 82/1, etc. leading to the U-shaped metallized ceramic strip 51 for the collector of the power transistor, are shown.

Figure 4:
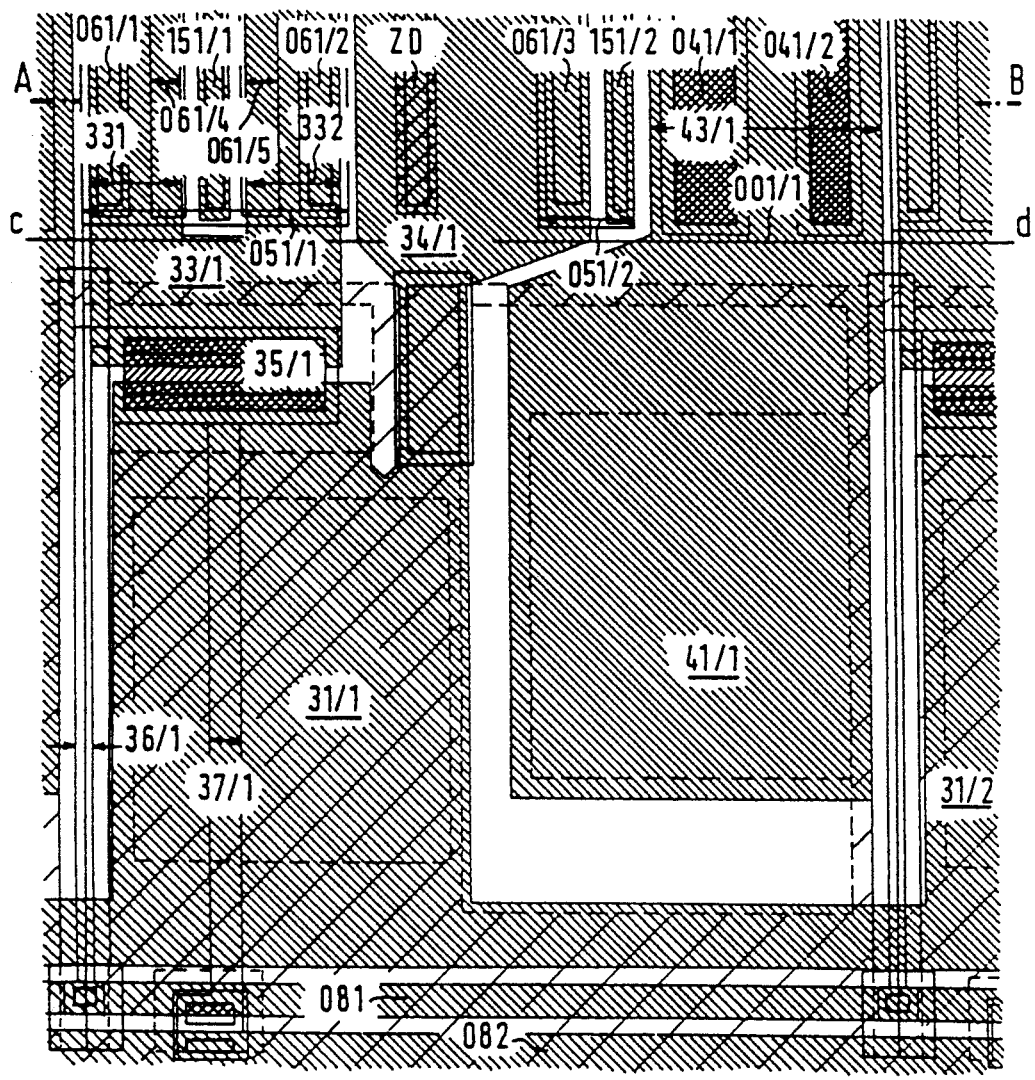
FIG. 4 shows on an enlarged scale a plan view of a transistor cell with connection spots for its emitter and collector.
Figure 5:
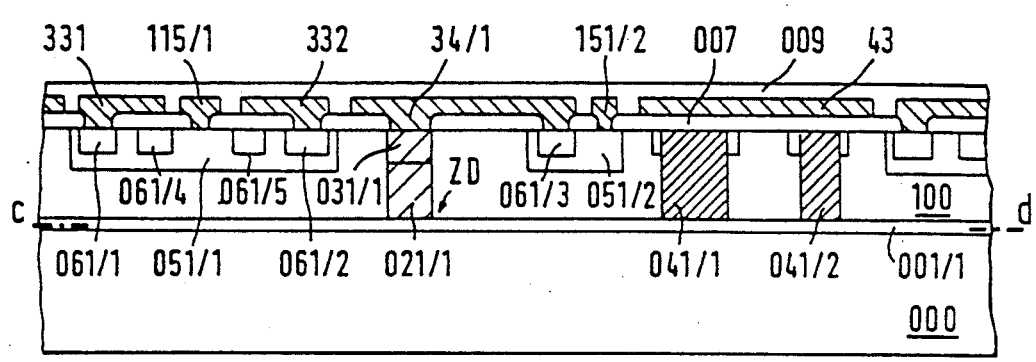
FIG. 5 shows a sectional view of the cell of FIG. 4 taken along the line A-B.

In FIGS. 4 and 5, simplified structures representing the manufacturing process of the power transistor of this invention are illustrated without showing the mutual displacement or staggering produced by underetching or underdiffusion and so on.

In the FIGS. 4 and 5, there is illustrated a portion of substrate (p−) 000 of the chip 22, a burried layer (n+) 001, a lower isolating diffusion (p+) 002, an epitaxial (n−) 100, an upper isolating diffusion (p+) 003, a collector connection diffusion (n+) 004, a base diffusion (p) 005, an emitter diffusion (n+) 006, a cover oxide layer 007, a metallization 008, a protective layer 009, and contact windows 070, 090 in planes 007, 009.

The two isolating diffusions 002 and 003 are indicated by broad etching, the collector connection diffusion 004 is indicated by narrow etching inclined upwards from the left side to the right side, the structured metallization 008 is indicated by narrow etching descending from the left side to the right side. The protective layer 009 can consist of a silan or of plasma-oxide or of a plasma-nitride.

The width of a transistor cell in a linear power transistor is determined by the nominal lost power to be conducted away, and determined by the number of the side-by-side arranged connection points or spots for the cell emitters and collectors. In the arrangement of this invention there is sufficient room in each transistor cell to accommodate further component parts such as for example a switching transistor for achieving a lower saturation voltage and a Zener diode. By the parallel connection of the Zener diodes in transistor cells, a power Zener diode protection of the power transistor is created.

In FIGS. 4 and 5, reference numerals 31/1 and 41/1 the connection contacts or spots for the emitter and the collector of the first transistor cell in the first row of cells of the power transistor. The emitter of the linearly operating partial or component transistor 53/1 (FIG. 7) consists of the two emitter diffusion strips 061/1 and 061/2 which are interconnected via metallizations 331, and 332 (integrated with metallization 33/1) and via current measuring resistor 35/1 with the emiiter-connection spot 31/1. The two emitter diffusion strips 061/1 and 061/2 lie in the base diffusion zone 051/1 from which are connected via the contact or terminal window and metallization 151/1 to a non-illustrated control circuit. Between the metallization 151/1 and two emitter diffusion strips 061/1 and 061/2 are arranged the emitter diffusions 061/4 and 061/5 which delimit the underlying pinch resistor 38/1 for stabilizing the current distribution of the component transistor and of parallel connections of all transistor cells to the power transistor. By means of the lower isolation diffusion 021/1 which lies on the burried layer 001/1 a Zener diode ZD is created which via an upper diffusion 031/1 is connected to the emitter metallization 34/1 of the partial transistor 54/1 operating as a switching transistor (FIG. 7) with emitter 061/3, base 051/2 and base contact or terminal 151/2. The connection spot 41/1 joins metallization 43 for connection of the burried layer diffusions 001/1 and divided collector connection diffusion 041/1 and 042/2. The buried layer diffusion 001/1 extends from the line cd upwards. The potential drop across the measuring resistor 35/1 is applied via the measuring resistor 36/1 to a common conductor web 081 which leads for example to a regulating circuit. The ground potential of the resistor 35/1 is applied via the resistor 37/1 to a common conductor web 081 which provides a reference potential of the regulating circuit which is independent of the emitter current of the power transistor. The reference numeral 31/2 denotes a connection contact or spot for the emitter of the next transistor cell.

The thickest full lines in FIG. 4 indicate the contours of a contact or terminal window, the two thinnest full lines indicate the contour of the emitter and burried layer. The base is indicated by medium thin lines as a contact or terminal window. All reference numerals in the plan view of FIG. 4 and the sectional view along the line A–B of FIG. 5 denote the same component parts or process zones. In FIG. 5, the reference numeral 000 indicates a silicon substrate and reference numeral 100 indicates an epitaxial layer.

If in the semiconductor manufacturing process, a two layer metallization and polysilicon are employed, similarly as in the U.S. Pat. No. 4,656,496 for example, then it is possible to stabilize the emitter current density of the entire power transistor by breaking up the emitter structures of respective transistor cells into a plurality of emitter portions, whereby a resistor is provided between each emitter portion and the emitter connection spot. A resistor zone of polysilicon applied between the emitter diffusion zone and the superimposed metallization is also applicable for the stabilization of the emitter current density.

In operation, power loss heat generated in the transistor cells is to be conducted away at least by the base plate. If the distance between the two rows of transistor cells amounts at least to the thickness of the chip then the two rows of cells are thermally decoupled. Depending on the heat resistance of the base plate the transistor cells have a highest temperature approximately in their center and the highest temperature is also in the center of respective rows of cells. In arrangements which are subject to high thermal shock flows it is therefore of advantage to reduce the emitter current density and thus the lost power density approximately in the middle of each transistor cell in order to homogenize the temperature of the blocking layer. The same requirement is applicable also for the cells which are situated in the middle of respective cell rows.

Figure 6:
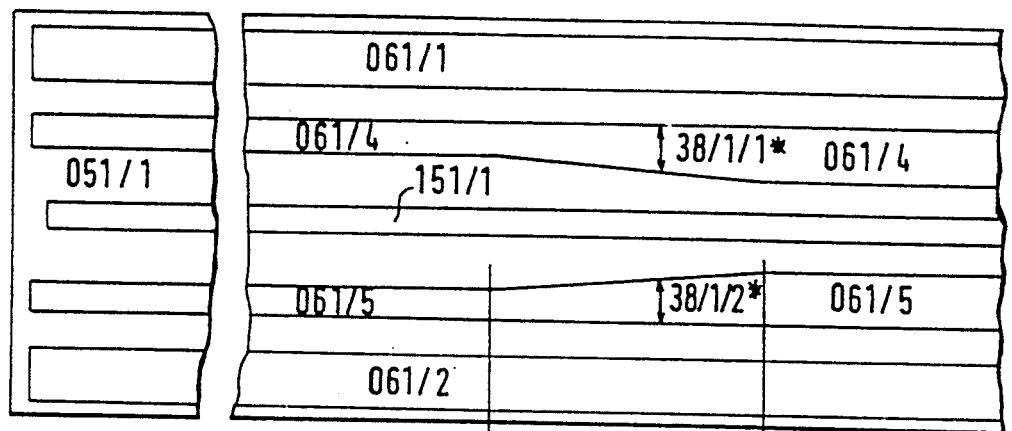
FIG. 6 shows a top view of a portion of a transistor cell having a variable pinch resistor between its base contact and its emitter diffusion zone.

In the section of a cell according to FIG. 6 there is illustrated a linear component transistor having a base 051/1, two emitter zones 061/1 and 061/2, a base contact or terminal 151/1, pinch resistors 38/1/1 and 38/1/2 extending respectively between the base contact 151/1 and the emitter zones 061/1 and 061/2. Each pinch resistor lies below an emitter diffusion zone 061/4 or 061/5 of a corresponding configuration. In the region between lines a and b the pinch resistors and the corresponding additional emitter diffusion zones increase in width. The maximum width after the line b is preserved approximately up to the middle of the length of the cell. In this manner, the pinch resistance is increased toward the center of the transistor cell and the emitter current density and hence the lost power density are reduced.

As mentioned before, for reducing manufacturing costs of the monolithic integrated power transistor it is desirable to achieve a high power density per a unit area. This can be achieved for example by soldering or bonding the transistor chip on a copper base plate. However, since in a mass production it cannot be guaranteed that bonded or soldered connections are made absolutely without shrink holes or shrink pipes and also since during the final quality test the pieces possessed with fine shrink pipes at bonding areas cannot be reliably detected, the provision of the so-called "selfhealing effect" in the power transistor design is absolutely necessary in order to achieve a high reliability. Methods of producing the selfhealing effect are known from patent publications (PCT) WO 87/01867 or DE-OS 35 32 383. In contrast to the proposed known solutions it may be of particular advantage to isolate collectors of respective transistor cells one from each other and to provide a narrow region in the collector branch conductors leading to the connection spot. If a part of a transistor cell or of a larger number of transistor cells becomes overheated due to an underlying shrink hole, it exhibits an intrinsic conduction and consequently the cell part in question starts conducting almost all available current and the narrow conductor region or regions burn up. As a consequence, the cell containing the destructed part is separated from the intact remainder of the power transistor. To prevent the feeding of current into the base of a destroyed cell which is fused with its emitter, there are provided in the simplest case resistors between the base conductors 151/1, 151/2, etc., and a circuit for delivering of the control current.

Figure 7:
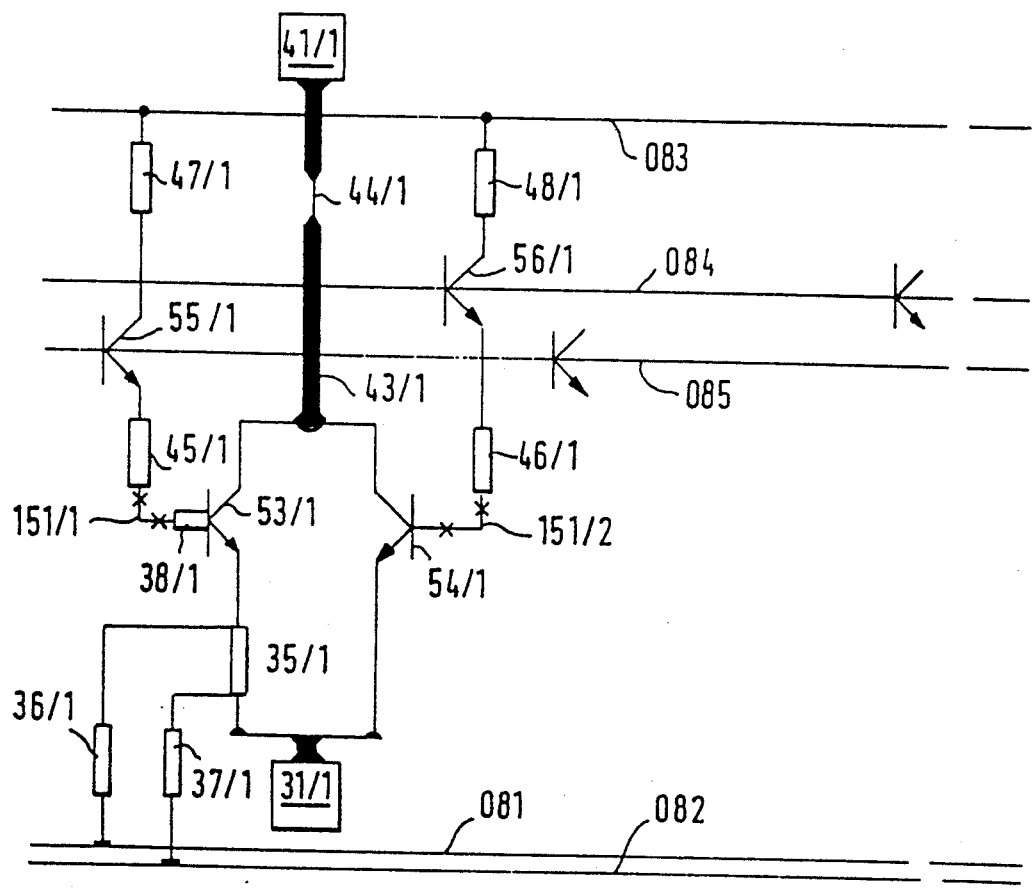
FIG. 7 is a schematic circuit diagram of a transistor cell of the power transistor with means to automatically separate a defective cell.

The circuit diagram of FIG. 7 shows, apart from the linear operating component transistor 53/1 and the parallel-connected switching transistor 54/1, the driving transistors 55/1 and 56/1. The base of linear transistor 53/1 is connected via the pinch resistor 38/1 and a decoupling resistor 45/1 with the emitter of the drive transistor 55/1 whose base is connected to the common conductor web 085 which supplies the linear control signal. The collector of the driving transistor is connector via a resistor 47/1 to the common conductor web 083 connected to the positive pole of the power supply. The base of the switching transistor 54/1 is also connected via a decoupling resistor 46/1 with the emitter of a drive transistor 56/1. The base of the drive transistor is connected to the common conductor web 084 and its collector is connected via resistor 48/1 to the common conductor web 083 leading to the positive pole. The collectors of component transistors 53/1 and 54/1 are connected to the collector connection spot 41/1 via a collector branch conduit conductor 43/1 having a narrow region 44/1 acting as a "burn up" region. The control circuit is reproduced in the same manner in each transistor cell of the power transistor.

The decoupling resistors 45/1 and 46/1 can be provided also between bases of the corresponding driver transistor 55/1 or 56/1 and the common conductors 084 or 084.

Figure 8:
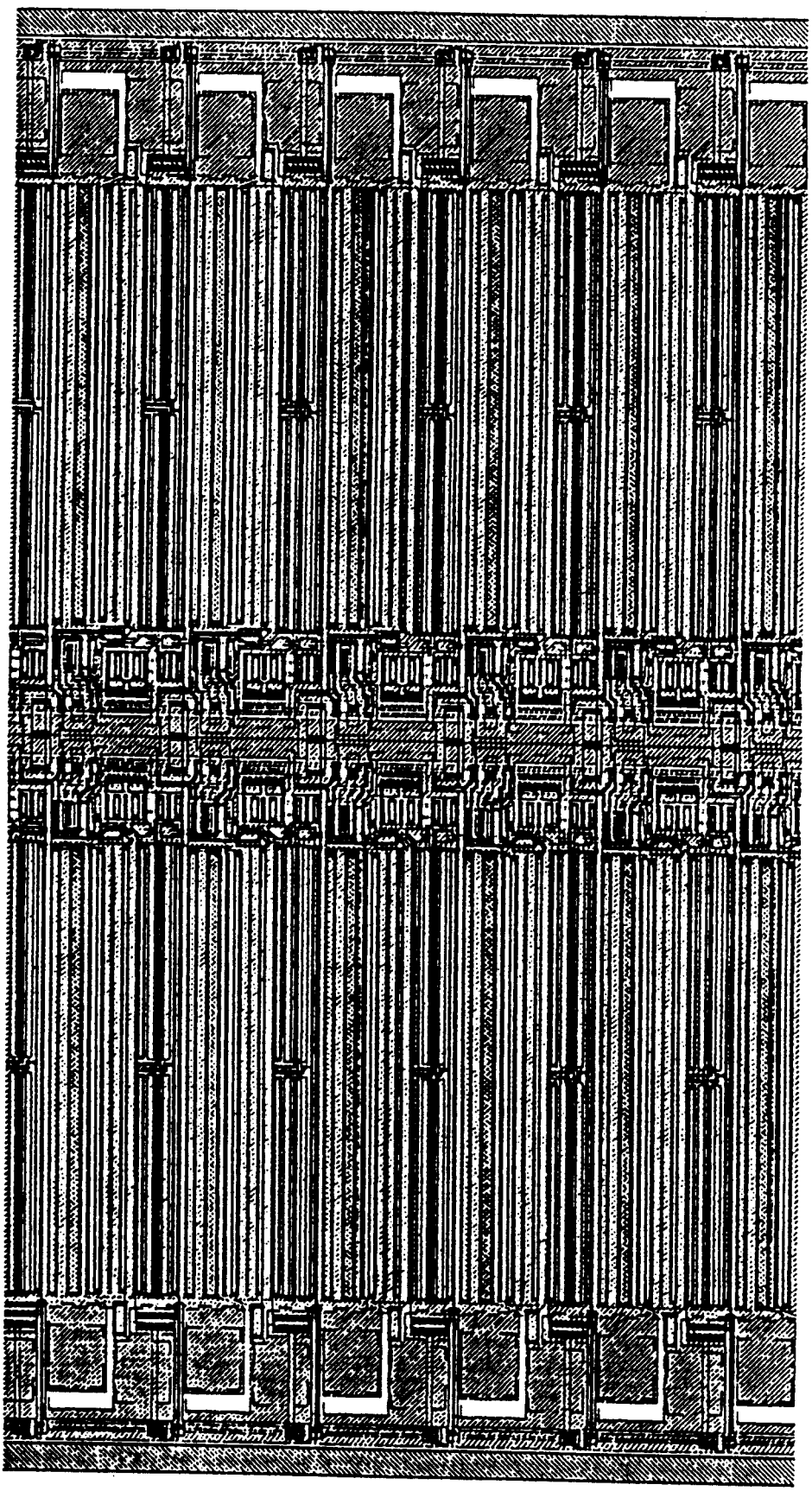
FIG. 8 is a plan view of a part of the overall layout of a two row power transistor chip structure.

FIG. 8 illustrates a section of a layout of the above described power transistor having two rows of transistor cells. The distance between the two rows is slightly above 600 um, thus providing a good thermal decoupling of the two transistor cell rows. The intermediate space between the two rows contains the control circuit and the Zener diodes.

While the invention has been illustrated and described as embodied in specific examples of a monolithic integrated power transistor structure, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A power transistor structure, comprising a single monolithic integrated chip having an upper surface and including a plurality of transistor cells arranged in two rows, each of said transistor cells containing at least one component transistor and transistor electrode contacts, two rows of connection points mirror symmetrically arranged on the upper surface of said single monolithic integrated chip, branch conductors for connecting consecutive connection points in each row of connection points alternatingly to emitter and collector contacts of an assigned row of transistor cells, and said rows of connection points extending along opposite edges of said single monolithic integrated chip.

2. A power transistor structure as defined in claim 1 wherein said rows of transistor cells are spaced apart at a distance corresponding at least to the thickness of said single monolithic integrated chip.

3. A power transistor structure as defined in claim 2 further comprising power supply conductors arranged between said two rows of transistor cells.

4. A power transistor structure as defined in claim 3 further comprising protective circuits against overvoltage of avalanche diodes arranged between said two rows of transistor cells.

5. A power transistor structure as defined in claim 1 wherein each of said transistor cells has an elongated configuration and includes an elongated base zone, a base contact, emitter diffusion zones at each side of the base contact, pinch resistors arranged between the base contact and the emitter diffusion zones and being provided with additional emitter diffusion zones, said pinch resistors and said additional emitter diffusion zones increasing in width toward the center of the transistor cell to stabilize a current density in an emitter of the transistor when operating in a linear range.

6. A power transistor structure as defined in claim 5 wherein said pinch resistors are formed by said additional emitter diffusion zones.

7. A power transistor structure as defined in claim 1 wherein said transistor cells have an elongated configuration and include an elongated emitter having an emitter contact window and a superimposed emitter metallization, and further comprising a resistor layer of a doped polysilicon arranged between the emitter contact window and the superimposed emitter metallization to stabilize a current density in the emitter when operating in a linear range.

8. A power transistor structure as defined in claim 7 wherein the current density in the emitter of one of the transistor cells is reduced by reducing a width of the emitter contact window.

9. A power transistor structure as defined in claim 7 wherein the current density in the emitter of one of the transistor cells is reduced by reducing a width of a resistor layer arranged between the emitter contact window and the emitter metallization.

10. A power transistor structure as defined in claim 1 wherein each of the transistor cells has an elongated configuration defining a longitudinal axis, and portions of the transistor cell subject to a lower current density extend in a center region of the transistor cell along said longitudinal axis whereas other portions of the transistor cell subject to a higher current density extend in cooler marginal parts of the transistor cell.

11. A power transistor structure as defined in claim 1 wherein each of said transistor cells includes a plurality of the component transistors, each operated with a different current density, so that the component transistors subject to a lower current density are arranged in a warmer central part of the cell whereas the component transistors operating at a higher current density are arranged in cooler marginal parts of the cell.

12. A power transistor structure as defined in claim 1 wherein the transistor cells situated in a warmer central part of the rows of transistor cells are operated at a lower current density than the transistor cells in cooler end parts of the rows.

13. A power transistor structure as defined in claim 1 further comprising a measuring resistor arranged between an emitter conductor and an emitter connection spot in each cell to measure emitter current for use in current regulation or current limitation.

14. A power transistor structure as defined in claim 13 wherein at least one of said transistor cells includes a first component transistor and a second component transistor whose emitter is directly connected to the emitter connection spot for the emitter of said cell.

15. A power transistor structure as defined in claim 13, further comprising a common emitter conductor web, the measuring resistor connecting the emitter conductor with said common emitter conductor web, and a decoupling resistor for applying a potential of said emitter electrode to the common emitter conductor web leading to a regulating circuit.

16. A power transistor structure as defined in claim 15 further comprising a common reference conductor web which provides a reference potential of the regulating circuit independent of an emitter current in the emitter conductor and an additional decoupling resistor connecting the common reference conductor web to the measuring resistor.

17. A power transistor structure as defined in claim 13 wherein said measuring resistor has a positive temperature coefficient at least partially compensated by control circuits between a control conductor web and the base of the component transistor, said control circuits having temperature coefficients and means for adjusting the temperature coefficients.

18. A power transistor structure as defined in claim 1 wherein said transistor cells include a buried layer and an outwardly directed common conductor web for emitter connections, and at least one of said cells includes a p-doped zone lying on said buried layer below said common conductor web to form an avalanche diode.

19. A power transistor structure as defined in claim 1 wherein each of said transistor cells has a metallized collector branch conductor leading from a collector connection spot to an assigned collector connection point on said upper surface of the chip, said collector branch conductor having a narrow portion which, when one of the transistor cells is damaged, burns up and separates the collectors of the other transistor cells from the transistor cell which has been damaged.

20. A power transistor structure as defined in claim 19 further comprising a common conductor web connected to base contacts of all of the transistor cells for base control of all transistor cells, and decoupling resistors connected between said common conductor web and the base contacts of the transistor cells to decouple the common conductor web from one of the transistor cells which has been damaged.

21. A power transistor structure as defined in claim 1, further comprising bonded wires for connecting the consecutive connection points in each row of connection points alternatively to common emitter and collector conductors arranged spaced from said chip.

22. A power transistor monolithic integrated chip structure, comprising a plurality of parallel connected transistor cells arranged in two rows within said chip structure; each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells; said rows of connection points extending along opposite edges of said chip structure; said rows of transistor cells being spaced apart at a distance corresponding at least to a thickness of said chip structure; power supply conductors arranged between said two rows of transistor cells; and protective circuits against overvoltage of avalanche diodes arranged between said rows of said transistor cells.

23. A power transistor monolithic integrated chip structure, comprising a plurality of parallel connected transistor cells arranged in two rows within said chip structure;

each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells;

said rows of connection points extending along opposite edges of said chip structure; wherein each of said transistor cells has an elongated configuration and includes an elongated base zone, a base contact, emitter diffusion zones at each side of the base contact, pinch resistors arranged between the base contact and the emitter diffusion zones and being provided with additional emitter diffusion zones; said pinch resistors and said additional emitter diffusion zones increasing in width toward the center of the transistor cell to stabilize a current density in an emitter of the transistor when operating in a linear range.

24. A power transistor monolithic integrated chip structure as defined in claim 23 wherein said pinch resistors are formed by said additional emitter diffusion zones.

25. A power transistor monolithic integrated chip structure, comprising a plurality of parallel connected transistor cells arranged in two rows within said chip structure; each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells; said rows of connection points extending along opposite edges of said chip structure; wherein each of said transistor cells has an elongated configuration and includes an elongated emitter having an emitter contact window and a superimposed emitter metallization; and further comprising a resistor layer of a doped polysilicon arranged between the emitter contact window and the superposed emitter metallization to stabilize a current density in the emitter when operating in a linear range.

26. A power transistor monolithic integrated chip structure as defined in claim 25 wherein the current density in the emitter of a transistor cell is reduced by reducing a width of the emitter contact window.

27. A power transistor monolithic integrated chip structure as defined in claim 26 wherein the current density in the emitter of a transistor cell is reduced by reducing a width of a resistor layer arranged between the emitter contact window and the emitter metallization.

28. A power transistor monolithic integrated chip structure, comprising a plurality of parallel connected transistor cells arranged in two rows within said chip structure; each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells; said rows of connection points extending along opposite edges of said chip structure; each transistor cell having an elongated configuration defining a longitudinal axis; and portions of the transistor cell subject to a lower current density extend in a center region of the transistor cell along said longitudinal axis whereas other portions of the transistor cell subject to a higher current density extend in cooler marginal parts of the transistor cell.

29. A power transistor monolithic integrated chip structure, comprising a plurality of parallel connected transistor cells arranged in two rows within said chip structure; each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells; said rows of connection points extending along opposite edges of said chip structure; each of said transistor cells includes a plurality of the component transistors, each of the component transistors being operated with a different current density, so that a group of the component transistors subject to a lower current density than a remaining portion of the component transistors are arranged in a warmer central part of the transistor cell and the remaining portion of the component transistors operating at a higher current density are arranged in cooler marginal parts of the transistor cell.

30. A power transistor monolithic integrated chip structure as defined in claim 29 wherein the transistor cells situated in a warmer central part of respective cell rows are operated at a lower current density than the transistor cells in cooler end parts of the respective cell rows.

31. A power transistor monolithic integrated chip structure, comprising a plurality of parallel connected transistor cells arranged in two rows within said chip structure; each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells; said rows of connection points extending along opposite edges of said chip structure; and a measuring resistor arranged between an emitter conductor and an emitter connection spot in each of the transistor cells to measure emitter current for use in current regulation or current limitation.

32. A power transistor monolithic integrated chip structure as defined in claim 31 wherein at least one of said transistor cells includes a first component transistor and a second component transistor whose emitter is directly connected to the emitter connection spot for the emitter of said cell.

33. A power transistor monolithic integrated chip structure as defined in claim 31, further comprising a common emitter conductor web, the measuring resistor connecting the emitter conductor with said common emitter conductor web, and a decoupling resistor for applying a potential of said emitter electrode to the common emitter conductor web leading to a regulating circuit.

34. A power transistor monolithic integrated chip structure as defined in claim 33 further comprising a common reference conductor web which provides a reference potential of the regulating circuit independent of an emitter current in the emiiter conductor and an additional decoupling resistor connecting the common reference conductor web to the measuring resistor.

35. A power transistor monolithic integrated chip structure as defined in claim 31 wherein said measuring resistor has a positive temperature coefficient at least partially compensated by control circuits between a control conductor web and the base of the transistor, said control circuits having temperature coefficients and means for adjusting the temperature coefficients.

36. A power transistor monolithic integrated chip structure, comprising a plurality of parallel connected transistor cells arranged in two rows within said chip structure; each of said transistor cells containing at least one component transistor and transistor electrode contacts, two rows of connection points mirror symmetrically arranged on an upper surface of said chip structure; branch conductors for connecting consecutive connection points in each row of connection points alternatingly to emitter and collector contacts of an assigned row of transistor cells; said rows of connection points extending along opposite edges of said chip structure; said transistor cells being electrically insulated from each other and each having a metallized branch conductor leading from a collector connection spot to a collector connection point on the upper surface of the chip structure, said collector branch conductor having a narrow portion which, when an assigned transistor cell is damaged, burns up and separates the collectors of the other transistor cells from the assigned transistor cell which has been damaged.

37. A power transistor monolithic integrated chip structure as defined in claim 36 further comprising a common conductor web connected to base contacts of all of the transistor cells for base control of all transistor cells, and decoupling resistors connected between said common conductor web connected to the base contacts and the base contacts of the transistor cells to decouple the common conductor web of the base contacts from one of the respective transistor cells which has been damaged.

* * * * *